United States Patent
Wang

(10) Patent No.: US 10,372,570 B2
(45) Date of Patent: Aug. 6, 2019

(54) STORAGE DEVICE, TEST SYSTEM FOR TESTING THE SAME, AND METHOD THEREOF

(71) Applicant: Samsung Electronics Co., Ltd., Suwon-si, Gyeonggi-do (KR)

(72) Inventor: KyuYeul Wang, Pyeongtaek-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 146 days.

(21) Appl. No.: 15/481,441

(22) Filed: Apr. 6, 2017

(65) Prior Publication Data

US 2018/0039554 A1 Feb. 8, 2018

(30) Foreign Application Priority Data

Aug. 4, 2016 (KR) ........................ 10-2016-0099603

(51) Int. Cl.
| | | |
|---|---|---|
| G06F 11/00 | (2006.01) | |
| G06F 11/22 | (2006.01) | |
| G11C 29/56 | (2006.01) | |
| G06F 11/263 | (2006.01) | |

(52) U.S. Cl.
CPC ........ *G06F 11/2221* (2013.01); *G06F 11/263* (2013.01); *G11C 29/56* (2013.01)

(58) Field of Classification Search
CPC .. G06F 11/2221; G06F 11/263; G06F 11/273; G06F 11/2273; G06F 11/20; G11C 29/10; G11C 29/56004; G11C 29/70; G11C 29/765

See application file for complete search history.

(56) References Cited

U.S. PATENT DOCUMENTS

| | | |
|---|---|---|
| 7,679,133 B2 | 3/2010 | Son et al. |
| 8,499,308 B2 | 7/2013 | Stenfort et al. |
| 8,553,466 B2 | 10/2013 | Han et al. |
| 8,559,235 B2 | 10/2013 | Yoon et al. |
| 8,612,644 B2 | 12/2013 | Kumasawa et al. |
| 8,654,587 B2 | 2/2014 | Yoon et al. |
| 8,850,128 B2 | 9/2014 | Chu et al. |
| 9,207,749 B2 | 12/2015 | Diamant et al. |
| 9,245,613 B2 | 1/2016 | Lee et al. |
| 9,280,298 B2 | 3/2016 | Kikuchi |

(Continued)

OTHER PUBLICATIONS

Kennedy, Patrick, AIC HA202-PH Active-Active 24 bay dual port NVMe system, Jun. 2, 2016, https://www.servethehome.com/aic-ha202-ph-active-active-24-bay-dual-port-nvme-system/ (Year: 2016).*

(Continued)

*Primary Examiner* — Marc Duncan
(74) *Attorney, Agent, or Firm* — Renaissance IP Law Group LLP

(57) ABSTRACT

Embodiments include a method of a test system that comprises a host device and at least one storage device having multiple ports connected to the host device through a multi-port connection, the method comprising: issuing, by a test program at the host device, a first command; generating, by a device driver at the host device, a plurality of second commands in response to the first command; and simultaneously transferring, by the host device, the second commands to each of the at least one storage device.

17 Claims, 10 Drawing Sheets

(56) References Cited

U.S. PATENT DOCUMENTS

| | | | |
|---|---|---|---|
| 9,830,958 B2* | 11/2017 | Gupta | G11C 7/1042 |
| 9,946,620 B2* | 4/2018 | Gorman | G06F 11/263 |
| 2003/0120974 A1* | 6/2003 | Adams | G06F 11/2242 |
| | | | 714/31 |
| 2008/0141055 A1* | 6/2008 | Danilak | G06F 13/1668 |
| | | | 713/340 |
| 2008/0155562 A1 | 6/2008 | Stenfort et al. | |
| 2009/0083476 A1 | 3/2009 | Pua et al. | |
| 2009/0121271 A1 | 5/2009 | Son et al. | |
| 2010/0275074 A1* | 10/2010 | Nicolaidis | G11C 29/16 |
| | | | 714/718 |
| 2011/0113279 A1* | 5/2011 | Cagno | G06F 11/2089 |
| | | | 714/5.11 |
| 2011/0153959 A1 | 6/2011 | Chu et al. | |
| 2011/0216603 A1 | 9/2011 | Han et al. | |
| 2011/0231683 A1 | 9/2011 | Kumasawa et al. | |
| 2011/0233648 A1 | 9/2011 | Seol et al. | |
| 2012/0051143 A1 | 3/2012 | Yoon et al. | |
| 2013/0279262 A1 | 10/2013 | Yoon et al. | |
| 2014/0047288 A1 | 2/2014 | Lee et al. | |
| 2014/0068281 A1 | 3/2014 | Diamant et al. | |
| 2014/0281282 A1 | 9/2014 | Kikuchi | |
| 2015/0067418 A1 | 3/2015 | Lee | |
| 2015/0095723 A1 | 4/2015 | Han | |
| 2015/0242160 A1 | 8/2015 | Myouga | |
| 2015/0262633 A1* | 9/2015 | Lee | G11C 7/1075 |
| | | | 710/308 |
| 2015/0324124 A1 | 11/2015 | Mehta et al. | |
| 2016/0055198 A1 | 2/2016 | Park et al. | |

OTHER PUBLICATIONS

Kennedy, Patrick, New Dual Port NVMe SSDs: Intel DC D3700 and DC D3600, Mar. 31, 2016, https://www.servethehome.com/new-dual-port-ssds-intel-dc-d3700-dc-d3600 (Year: 2016).*

Kudryavtsev, Andrey, An Introduction to Dual-Port NVMe SSD, Mar. 31, 2016, IT Peer Network (Year: 2016).*

HA202-PH, no date given, http://www.aicipc.com/en/productdetail/10831 (Year: 2018).*

* cited by examiner

FIG. 5

| Bit<br>Byte | 7 | 6 | 5 | 4 | 3 | 2 | 1 | 0 |
|---|---|---|---|---|---|---|---|---|
| 0 | OPERATION CODE (88h) ||||||||
| 1 | RDPROTECT ||| DPO | FUA | Reserved | FUA_NV | Reserved |
| 2 | ADDR1 ||||||||
| 9 | ||||||||
| 10 | GROUP NUMBER (Sector Count) ||||||||
| 13 | ||||||||
| 14 | Restricted | Reserved |||||||
| 15 | CONTROL ||||||||
| 16 | Flag (Dual Port Delimiter) ||||||||
| 17 | ADDR2 ||||||||
| 24 | ||||||||
| 25 | ||||||||
| 28 | ||||||||

STORAGE DEVICE, TEST SYSTEM FOR TESTING THE SAME, AND METHOD THEREOF

CROSS-REFERENCE TO RELATED APPLICATIONS

This U.S. non-provisional patent application claims under 35 U.S.C. § 119 to Korean Patent Application No. 10-2016-0099603 filed on Aug. 4, 2016 the entire contents of which are hereby incorporated by reference.

BACKGROUND

Embodiments described herein relate to a storage device, a test system that tests the storage device, and a test method thereof.

Currently, storage devices are being developed in a multi-port form to improve the efficiency of use. A conventional test device performs a test operation in such a way that an operation is performed at the minimum transfer speed or less by sequentially using ports of a multi-port storage device instead of simultaneously using all ports thereof. In addition, the conventional test device fails to access multiple ports in hardware/software.

SUMMARY

Embodiments include a method of a test system that comprises a host device and at least one storage device having multiple ports connected to the host device through a multi-port connection, the method comprising: issuing, by a test program at the host device, a first command; generating, by a device driver at the host device, a plurality of second commands in response to the first command; and simultaneously transferring, by the host device, the second commands to each of the at least one storage device.

Embodiments include a storage device comprising: a first port; a second port; at least one nonvolatile memory device; a first memory controller connected to the first port and configured to control at least a first part of the at least one nonvolatile memory device; and a second memory controller connected to the second port and configured to control at least a second part of the at least one nonvolatile memory device, wherein during a test operation: the first memory controller is configured to receive a first command through the first port and control the at least the first part of the at least one nonvolatile memory device in response to the first command; and the second memory controller is configured to receive a second command through the second port simultaneous with the first memory controller receiving the first command and control the at least the second part of the at least one nonvolatile memory device in response to the second command.

Embodiments include a test system comprising: a host device; and a plurality of devices under test (DUTs), each of which is connected to the host device through a multi-port connection, wherein the host device comprises: a central processing unit; and a host bus adapter connecting the central processing unit and the DUTs, wherein during a test operation, the host device is configured to transfer a first command to a first port of each of the DUTs while simultaneously transferring a second command to a second port of each of the DUTs.

Embodiments include a test method of a storage device, the method comprising: receiving a first command through a first port; receiving a second command through a second port while receiving the first command; testing a first memory in response to the first command; and testing a second memory in response to the second command while testing the first memory.

Embodiments include a test system, comprising: a plurality of ports; a processor configured to: generate a first test command; generate a plurality of second test commands in response to the first test command; and transmit each of the second test commands simultaneously to each of multiple devices under test (DUTs) through multiple ports of the ports.

BRIEF DESCRIPTION OF THE FIGURES

Embodiments will be described with reference to the following figures, wherein like reference numerals refer to like parts throughout the various figures unless otherwise specified, and wherein:

FIG. 5 is a drawing illustrating a structure of a command generated by the test program, to an embodiment;

DETAILED DESCRIPTION

Embodiments will be described with reference to the accompanying drawings. In some embodiments, a storage device may include a multi-port storage device and may be configured to perform a test operation through multiple ports, thereby reducing a test time and improving the efficiency of test.

Figure 1:
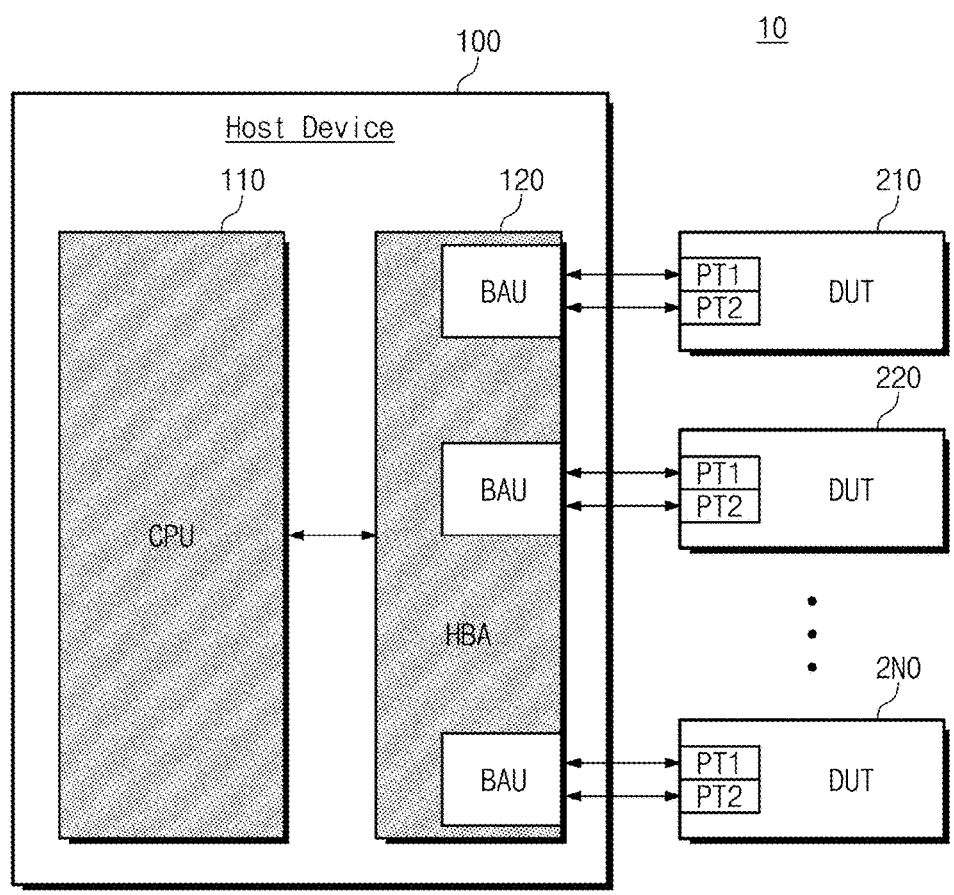
FIG. 1 is a drawing illustrating a test system according to an embodiment.

FIG. 1 is a drawing illustrating a test system 10 according to an embodiment. Referring to FIG. 1, the test system 10 may include a host device 100 and multiple devices under test (hereinafter referred to as "DUTs") 210, 220, . . . , 2N0 (N being an integer of 2 or more). Although three DUTs are illustrated, any number of DUTs may be present.

The host device 100 may include a central processing unit (CPU) 110 and a host bus adapter (HBA) 120. For example, the host device 100 may be a computing device.

The CPU 110 may be configured to perform a test operation on the DUTs 210, 220, . . . , 2N0 by controlling hardware/software/firmware. The host bus adapter 120 may be connected to the CPU 110 and may be configured to transfer a test command of the CPU 110 to each of the DUTs 210, 220, . . . , 2N0 and/or transfer a result value, which is output from each of the DUTs 210, 220, . . . , 2N0 executing the test command, to the CPU 110.

The host bus adapter 120 may be connected to a dual port PT1 and PT2 of each of the DUTs 210, 220 . . . 2N0. In an embodiment, the host bus adapter 120 may include multiple bus adapter units BAUs respectively corresponding to the DUTs 210, 220, . . . , 2N0, and each bus adapter unit BAU may be connected to the dual port PT1 and PT2 of the corresponding DUT. Here, the bus adapter units BAUs may be implemented to process test operations in parallel in response to the same test command. As illustrated in FIG. 1, one host bus adapter 120 is connected to the CPU 110. However in other embodiments, the number of host bus adapters 120 may be different. For example, in other embodiments, multiple host bus adapters 120 are connected to the CPU 110.

In an embodiment, the host device 100 may be configured to transfer a new test command to the DUTs 210, 220, . . . , 2N0 before receiving test result values corresponding to the test command from the DUTs 210, 220, . . . , 2N0. In an embodiment, to perform a test operation, the host device 100 may be configured to activate the dual port PT1 and PT2 of each of the DUTs 210, 220, . . . , 2N0. In an embodiment, the host device 100 may be configured to transfer a test command to each of the DUTs 210, 220, . . . , 2N0 through the dual port PT1 and PT2 thereof in a queuing manner.

Each of the DUTs 210, 220, . . . , 2N0 may be a memory device in which a test operation will be performed. In an embodiment, each of the DUTs 210, 220, . . . , 2N0 may include the dual port PT1 and PT2. Here, the ports PT1 and PT2 of each DUT may be configured to operate using the same communication protocol. For example, the communication protocol may be one or more of non-volatile memory express (NVMe), peripheral component interconnect express (PCIe), serial at attachment (SATA), small computer system interface (SCSI), serial attached SCSI (SAS), universal storage bus (USB) attached SCSI (UAS), Internet small computer system interface (iSCSI), fiber channel, or fiber channel over Ethernet (FCoE), and the like.

In an embodiment, the ports PT1 and PT2 of each DUT may be configured to be activated at the same time during a test operation of each DUT. In other words, a first test operation that is performed on a specific DUT through the first port PT1 and a second test operation that is performed on the specific DUT through the second port PT2 may be performed independently of each other, overlapping in time, and/or simultaneously.

In an embodiment, one to all of the DUTs 210, 220, . . . , 2N0 may be a solid state drive (SSD). For example, one to all of the DUTs 210, 220, . . . , 2N0 may be a SAS SSD.

In an embodiment, one to all of the DUTs 210, 220, . . . , 2N0 may be a hard disk drive (HDD). For example, one to all of the DUTs 210, 220, . . . , 2N0 may be a SAS HDD. Meanwhile, it should be understood that one to all of the DUTs 210, 220, . . . , 2N0 may be implemented with any type of dual-port memory device other than an SSD and an HDD.

The host device 100 may be physically connected to all the ports PT1 and PT2 of each of the DUTs 210, 220, . . . , 2N0 and may be configured to simultaneously access the ports PT1 and PT2.

While each of the DUTs 210, 220, . . . , 2N0 illustrated in FIG. 1 is illustrated as including two ports PT1 and PT2 , in other embodiments the number of ports may be different. For example, in some embodiments, one to all of the DUTs 210, 220, . . . , 2N0 includes three or more ports (multiple ports). Furthermore, each of the DUTs 210, 220, . . . , 2N0 may, but need not include the same number of ports.

The test system 10 according to an embodiment may be configured to perform a test operation on a DUT by using all the ports PT1 and PT2 of the DUT, thereby reducing a test time and improving the performance of test.

Figure 2A:
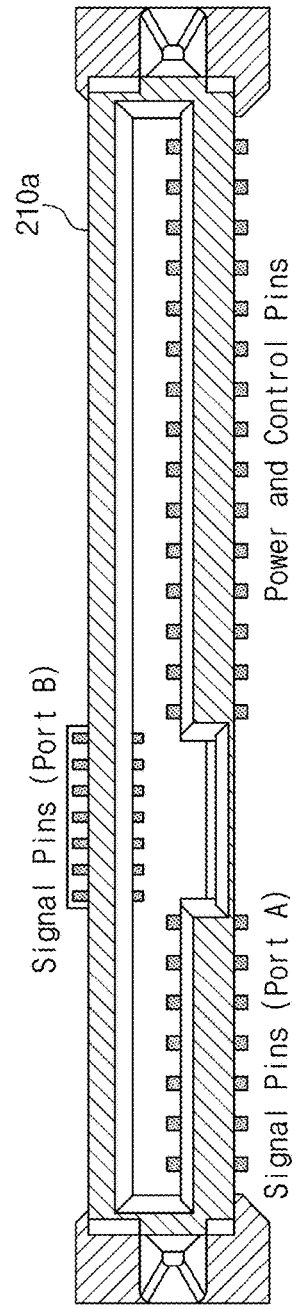
FIGS. 2A and 2B are views illustrating connectors each having a dual port, according to some embodiments.
Figure 2B:
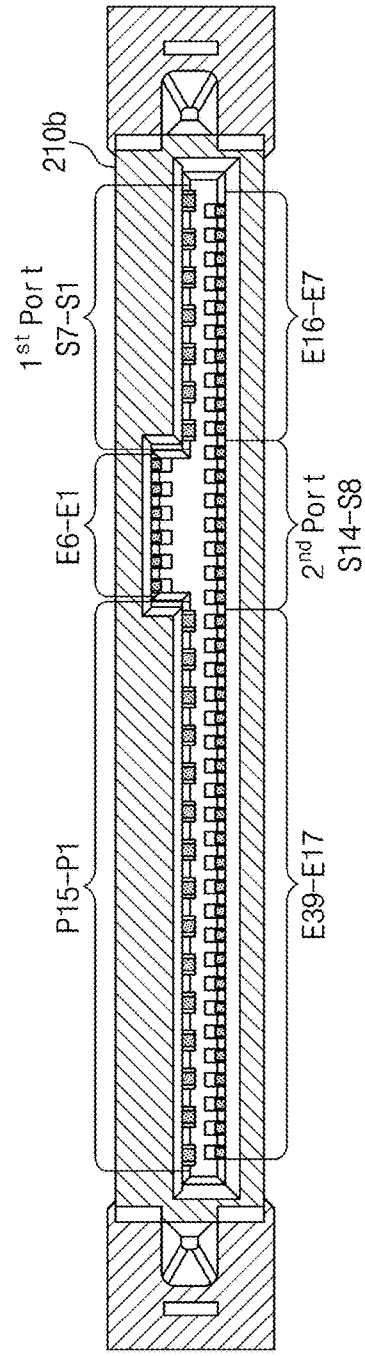

FIGS. 2A and 2B are views illustrating connectors 201a and 201b each having a dual port, according to embodiments. Referring to FIG. 2A, first signal pins and power and control pins are arranged on a first side surface of the first connector 201a, and second signal pins are arranged on a second side surface thereof, which is opposite to the first side surface. Here, the first signal pins constitute a first port "Port A", and the second signal pins constitute a second port "Port B".

Referring to FIG. 2B, power pins P1 to P15, PCIe sideband pins E1 to E6, and a first port S1 to S7 are arranged on a first side surface of the connector 201b, and PCIe lanes and sideband pins E17 to E39, a second port S8 to S14, and PCIe lanes and reference clock pins E7 to E16 are arranged on a second side surface thereof, which faces the first side surface of the connector 201b. In an embodiment, each of the connectors 201a and 201b may be implemented with an SSD form factor connector.

In other embodiments, the pin arrangements of each of the connectors 201a and 201b illustrated in FIGS. 2A and 2B may be different. A connector included in a storage device according to an embodiment may be implemented to have a dual port in various forms.

Figure 3:
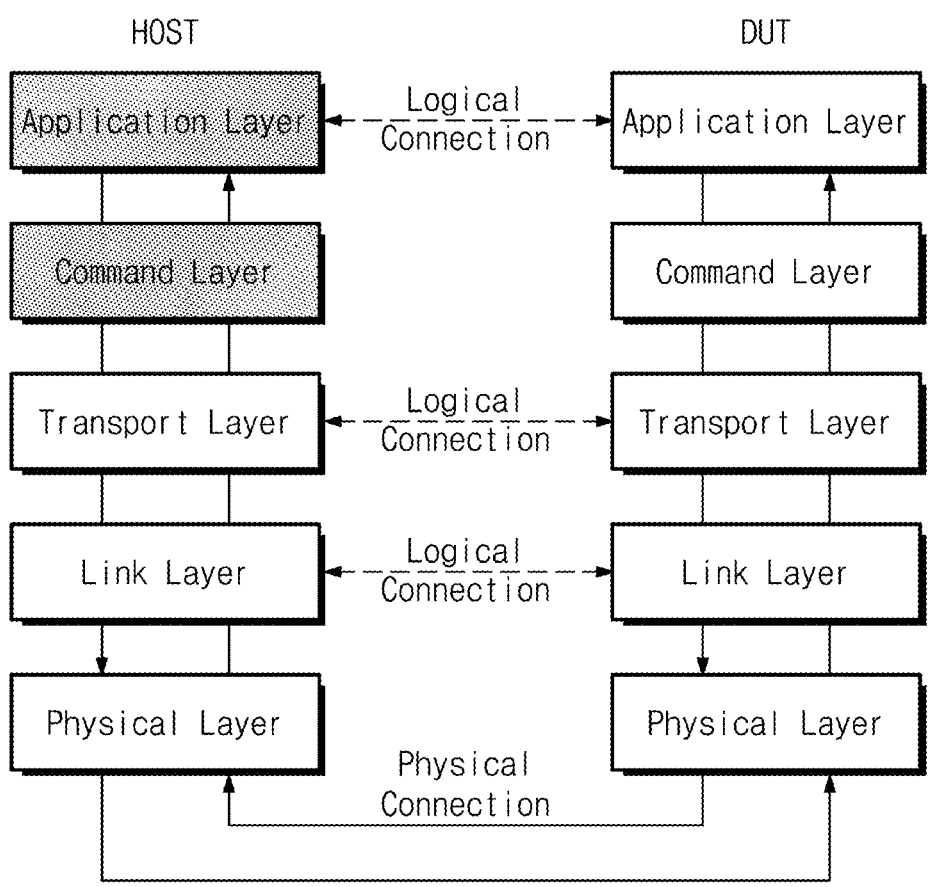
FIG. 3 is a drawing illustrating a software architecture of the test system, according to an embodiment.

FIG. 3 is a drawing illustrating a software architecture of the test system 10, according to an embodiment. Referring to FIGS. 1 to 3, the software architecture of the host device 100 for performing a test operation may include an application layer, a command layer, a transfer layer, a link layer, and a physical layer. A software architecture of a DUT (e.g., 210 of FIG. 1) in which the test operation is performed may include an application layer, a command layer, a transfer layer, a link layer, and a physical layer.

In an embodiment, the application layer of the host device 100 and the application layer of the DUT 210 may be logically connected to each other, the transfer layer of the host device 100 and the transfer layer of the DUT 210 may be logically connected to each other, and the link layer of the host device 100 and the link layer of the DUT 210 may be logically connected to each other.

In an embodiment, the host device 100 may be implemented with a test program (software) corresponding to the application layer and may be implemented with a kernel (or a device driver) corresponding to the command layer. Although a logical connection between the command layers is not illustrated, in some embodiments, a logical connection may be formed between the command layer of the host device 100 and the command layer of the DUT 210.

Here, the test program may be stored in a memory (not illustrated) of the host device 100. The test program may include a test sequence or test data, which is used to perform the test operation. For example, after storing specific data in a storage area of the DUT 210, the test program may read the stored data from the DUT 210. The test program may determine whether the test operation is successful, based on whether the read data is the same as the specific data. If a specific storage area of the DUT 210 is determined to be faulty, the test program may be configured to identify the specific storage area to the host device 100. In addition, the test program may be implemented to replace the specific storage area with a redundant area or to indicate that the specific storage area is faulty.

In an embodiment, to improve the efficiency of testing a multi-port DUT, the test program may be implemented to simultaneously generate multiple commands. In general, a program may transfer a command to a device driver (e.g., the kernel) to access a DUT.

In an embodiment, the physical layer of the host device 100 and the physical layer of the DUT 210 may be physically connected to each other. Here, the physical connection may be made by using the dual port PT1 and PT2. For example, the host device 100 may be implemented with hardware (e.g., PCIe ports) corresponding to a physical layer.

In an embodiment, a command issued from the application program may include an operation code (or opcode) for defining an operation, a logical block address for a control and a physical data access, and a transfer length indicating a quantity of data. The command issued from the test program according to an embodiment may further include information indicating the use of the dual port and an address added for supporting the dual port.

Figure 4:
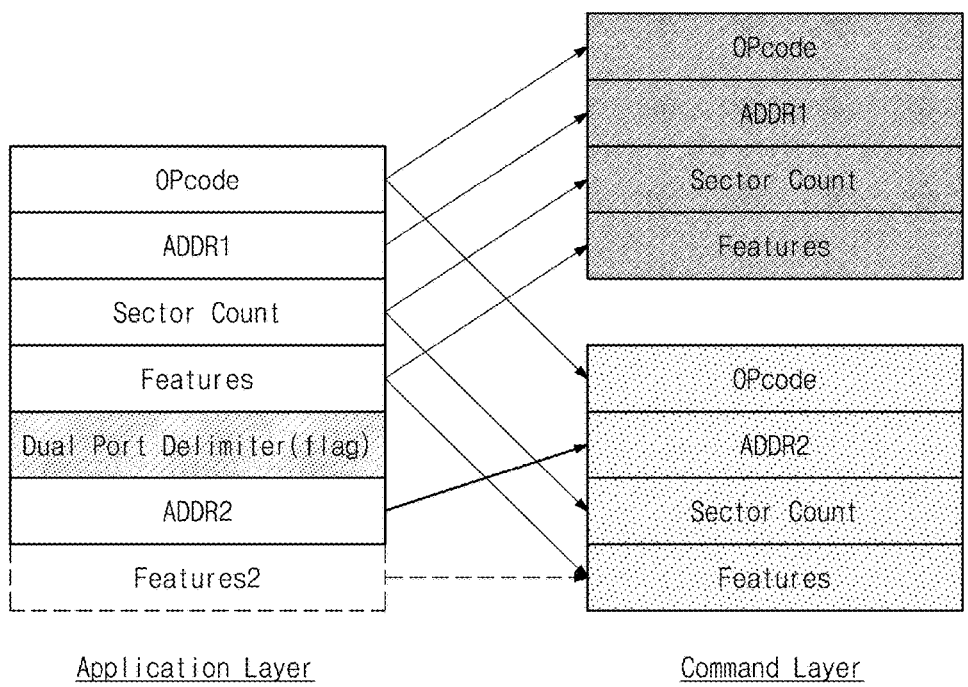
FIG. 4 is a drawing schematically illustrating a method in which a test program generates a dual port command, according to an embodiment.

FIG. 4 is a drawing schematically illustrating a method in which a test program generates a dual port command, according to an embodiment. Referring to FIG. 4, a command issued from the test program corresponding to the application layer may include an operation code OPcode, a first address ADDR1, a sector count corresponding to a transfer length, features, a dual port delimiter (flag), and a second address ADDR2.

Commands issued from the test program may be classified into two commands that the command layer. That is, the device driver may generate the two commands based on the dual port delimiter (flag). In an embodiment, a first command generated from the device driver may include the operation code, the first address ADDR1, the sector count, and the features. Here, the first command may be transferred to the first port PT1 of the two ports PT1 and PT2.

In an embodiment, a second command generated from the device driver may include the operation code, the second address ADDR2, the sector count, and the features. Here, the first command may be transferred to the second port PT2 of the two ports PT2 and PT2.

Although a command in the application layer is illustrated as including only two addresses, in other embodiments, any number of addresses may be included corresponding to the number of ports of a DUT. Furthermore, although an address has been used as an example of a portion of a command generated by the command layer that is different among the generated commands, in other embodiments, different portions of the generated commands may be different. For example, in other embodiments, the address and the features may be different between the generated commands. In such circumstances, the command in the application layer may also include the additional information such as the features for the second command Here, the features for the second command are illustrated with dashed lines.

In other embodiments, the method of generating the commands may be different than that illustrated in FIG. 4. The host device 100 according to other embodiments may issue commands corresponding to the dual port in various methods.

FIG. 5 is a drawing illustrating a structure of a command generated by the test program, to an embodiment. Referring to FIG. 5, a structure of a read command generated by the test program may include the operation code of one byte, the first address ADDR1 of twelve bytes, a group number corresponding to a transfer length, a flag indicating a the dual port delimiter of one byte, and the second address ADDR2 of twelve bytes.

In other embodiments, the structure of the read command may be different than that illustrated in FIG. 5. For example, the size of each of the addresses ADDR1 and ADDR2 may not be limited to twelve bytes. Other fields may or may not be present in the command Here, additional fields are illustrated as an example. Moreover, additional fields for different generated commands may be included after the second address ADDR2. For example, addresses for third and other additional commands may be included after the second address ADDR2.

The structure of the command generated by the test program according to an embodiment may be implemented by combining a flag and an additional address with a general command. This structure may make it possible to transfer multiple commands substantially during a time period in which the test program sends one command to the device driver. Accordingly, the test program according to an embodiment may minimize the overhead when commands are generated according to a dual port operation.

In an embodiment, a read function of "Dual Port SAS" may be expressed with read (rdbuf1, rdbuf2, LBA1, LBA2, Test_SC). Here, "rdbuf1" and "rdbuf2" may respectively indicate read data buffers output from the ports, "LBA1" may indicate a first logical block address, "LBA2" may indicate an additional logical block address, and "Test_SC" may indicate a sector count.

In an embodiment, a write function of "Dual Port SAS" may be expressed with write (wdbuf, LBA1, LBA2, Test_SC). Here, "wdbuf" may indicate a write buffer, "LBA1" may indicate a first logical block address, "LBA2" may indicate an additional logical block address, and "Test_SC" may indicate a sector count.

In an embodiment, a read function of "Dual Port NVM" may be expressed with readnvme (rdbuf1, rdbuf2, LBA1, LBA2, SC). Here, "rdbuf1" and "rdbuf2" may indicate a data buffer, "LBA1" may indicate a logical block address, "LBA2" may indicate a logical block address supporting the dual port, and "SC" may indicate a sector count.

In an embodiment, a write function of "Dual Port NVMe" may be expressed with writenvme (wdbuf, LBA1, LBA2, SC). Here, "wdbuf" may indicate a write buffer, "LBA1" may indicate a logical block address, "LBA2" may indicate a logical block address supporting the dual port, and "SC" may indicate a sector count.

In some embodiments, the device driver may determine whether to support a dual port operation based on a flag value of a command. If it is determined that the dual port operation is supported, the device driver may convert a command transferred from an upper layer into commands suitable to for the dual port operation.

Figure 6:
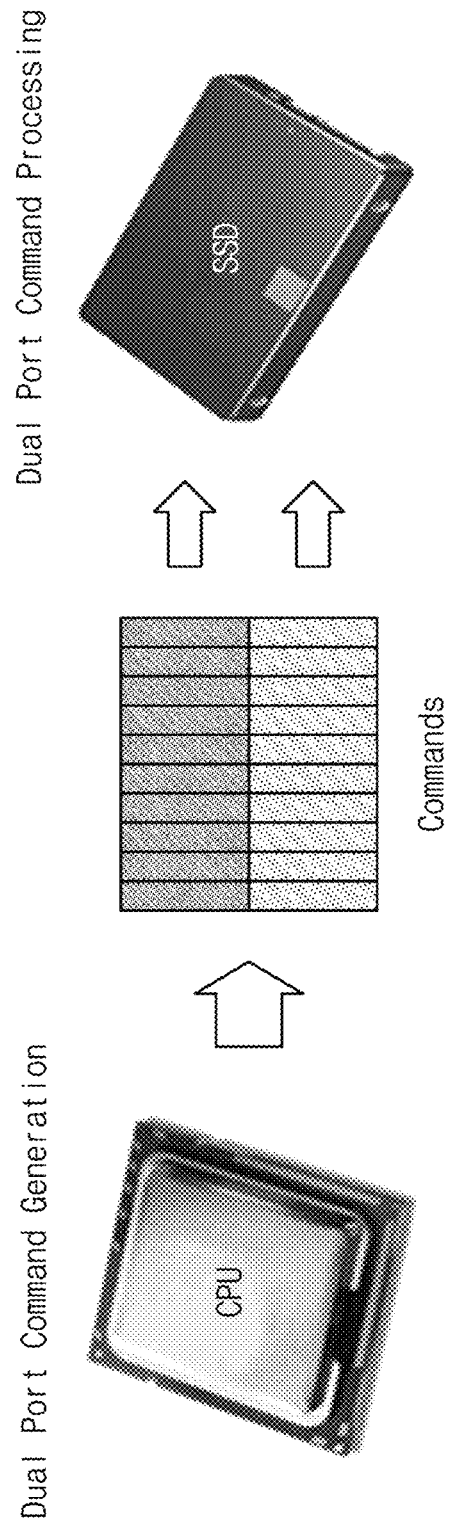
FIG. 6 is a drawing illustrating a process of processing a dual port command, according to an embodiment.

FIG. 6 is a drawing illustrating a process of processing a dual port command, according to an embodiment. Referring to FIG. 6, a CPU may issue a dual port command, and first commands may be sequentially transferred to a SSD through the first port PT1 while second commands are sequentially transferred to the SSD through the second port PT2. The SSD may simultaneously process the first and second commands received through the first and second ports PT1 and PT2.

In an embodiment, the first and second commands may be sent and received according to the queuing manner.

Figure 7:
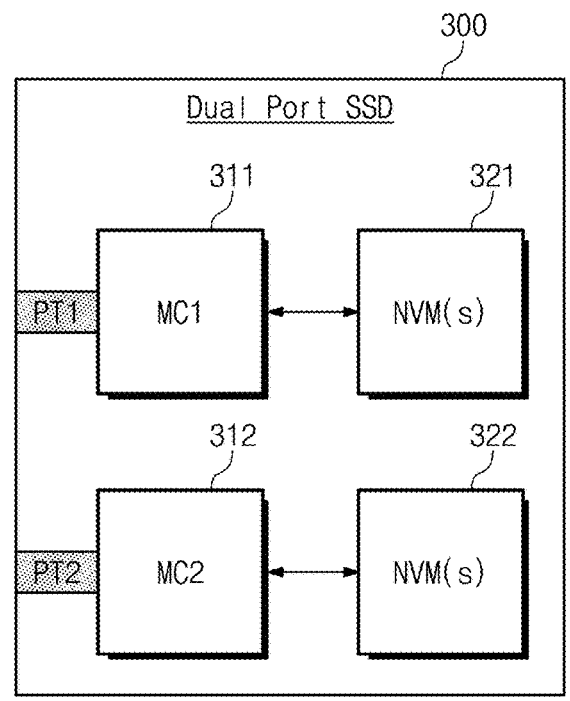
FIG. 7 is a block diagram illustrating a dual port solid state drive (SSD) according to an embodiment.

FIG. 7 is a block diagram illustrating a dual port SSD according to an embodiment. Referring to FIG. 7, a dual port SSD 300 may include a first memory controller (MC1) 311 connected to the first port PT1, at least one nonvolatile memory device (NVM(s)) 321 connected to the first memory controller 311, a second memory controller (MC2) 312 connected to the second port PT2, and at least one nonvolatile memory device (NVM(s)) 322 connected to the second memory controller 312.

The memory controllers 311/312 may each be connected to the respective nonvolatile memory device 321/322 through multiple channels. The memory controller 311/312 may be configured to perform an error correction code (ECC) function, wear leveling, bad block management, a signal processing operation, etc. Although not illustrated in FIG. 7, the memory controller 311/312 may include at least one processor, a buffer memory, a buffer memory controller, an error correction circuit, a host interface, a nonvolatile memory interface, etc.

The at least one processor may be configured to control overall operations of the dual port SSD 300. The buffer memory controller may be configured to control the buffer memory. The error correction circuit may be configured to calculate a value of an error correction code of data to be programmed during a write operation, correct data read during a read operation based on the value of the error correction code, and correct an error recovered from the nonvolatile memory device 321/322. The error correction circuit may be configured to correct an error using a coded modulation such as a low density parity check (LDPC) code, a Bose, Chaudhuri, Hocque-nghem (BCH) code, a turbo code, a Reed-Solomon code, a convolution code, a recursive systematic code (RSC), a trellis-coded modulation (TCM), a block coded modulation (BCM), or the like.

Although not illustrated in FIG. 7, the memory controller 311/312 may further include a code memory that stores code data for an operation thereof. The code memory may be implemented with a nonvolatile memory device.

The host interface may be configured to provide an interface function with an external host (e.g., 100 of FIG. 1). In an embodiment, the host interface may be implemented with various communication interfaces such as: non-volatile memory express (NVMe), peripheral component interconnect express (PCIe), serial at attachment (SATA), small computer system interface (SCSI), serial attached SCSI (SAS), universal storage bus (USB) attached SCSI (UAS), internet small computer system interface (iSCSI), fiber Channel, and fiber channel over Ethernet (FCoE).

The nonvolatile memory interface may provide an interface function with nonvolatile memory device 321/322. For example, the nonvolatile memory interface may be implemented with a legacy NAND interface or a vertical NAND flash memory (VNAND) interface. However, in other embodiments, the nonvolatile memory interface may be different.

The buffer memory may be configured to temporarily store data used to operate the memory controller 311/312. The buffer memory may include multiple memory lines storing data or a command. Here, the memory lines may be mapped to cache lines in various methods. The buffer memory may be configured to store page bitmap information and read count information. In an embodiment, the buffer memory may be implemented with a volatile memory or a nonvolatile memory. For example, the buffer memory may include a dynamic random access memory (DRAM), a phase random access memory (PRAM), or the like.

In an embodiment, the first command transferred through the first port PT1 may be processed by the first memory controller 311, and the second command transferred through the second port PT2 may be processed by the second memory controller 312. In an embodiment, the first and second memory controllers 311 and 312 may independently process commands corresponding thereto.

In an embodiment, each of the nonvolatile memory devices 321 and 322 may be a NAND flash memory, a vertical NAND flash memory (VNAND), a NOR flash memory, a resistive random access memory (RRAM), a phase change memory (PRAM), a magneto-resistive random access memory (MRAM), a ferroelectric random access memory (FRAM), a spin transfer torque random access memory (STT-RAM), or the like.

Furthermore, the nonvolatile memory may be implemented to have a three-dimensional (3D) array structure. In an embodiment, a 3D memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The circuit related on an operation of memory cells may be located in a substrate or on a substrate. The term "monolithic" means that layers of each level of the array are directly deposited on the layers of each underlying level of the array.

In an embodiment, the 3D memory array includes vertical NAND strings that are vertically oriented such that at least one memory cell is located over another memory cell. The at least one memory cell may comprise a charge trap layer. Each vertical NAND string may include at least one selection transistor located over memory cells. At least one selection transistor may have the same structure as those of memory cells and may be monolithically formed together with memory cells.

The three-dimensional memory array is formed of multiple levels and has word lines or bit lines shared among levels. The following patent documents, which are hereby incorporated by reference, describe suitable configurations for three-dimensional memory arrays, in which the three-dimensional memory array is configured as multiple levels, which is applied by Samsung Electronics Co., with word lines and/or bit lines shared between levels: U.S. Pat. Nos. 7,679,133; 8,553,466; 8,654,587; 8,559,235; and US Pat. Pub. No. 2011/0233648. The nonvolatile memory according to an exemplary embodiment may be applicable to a charge trap flash (CTF) in which an insulating layer is used as a charge storage layer, as well as a flash memory device in which a conductive floating gate is used as a charge storage layer.

Although the dual port SSD 300 is illustrated in FIG. 7 as including the nonvolatile memory devices 321 and 322 corresponding to the ports PT1 and PT2, respectively, in other embodiments the dual port SSD 300 may be different. For example, a multi-port SSD may include multiple similar ports, memory controllers, non-volatile memory devices, or the like.

Figure 8:
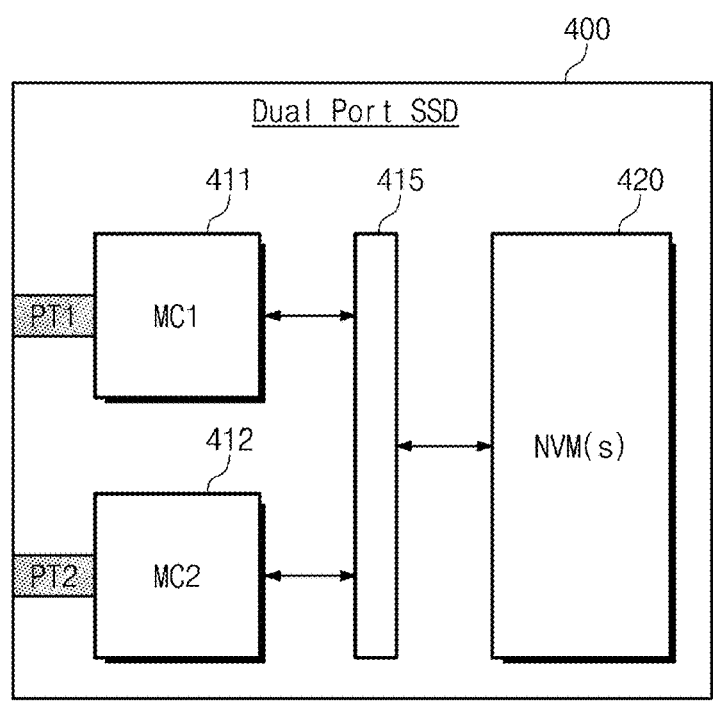
FIG. 8 is a block diagram illustrating a dual port SSD according to another embodiment.

FIG. 8 is a block diagram illustrating a dual port SSD according to another embodiment. Referring to FIG. 8, a dual port SSD 400 may be different from that of FIG. 7 in that the dual port SSD 400 includes at least one nonvolatile memory device 420 shared through a bus 415. First and second memory controllers 411 and 412 may be implemented to perform the same function as those of the first and second memory controllers 311 and 312 of FIG. 7.

Figure 9:
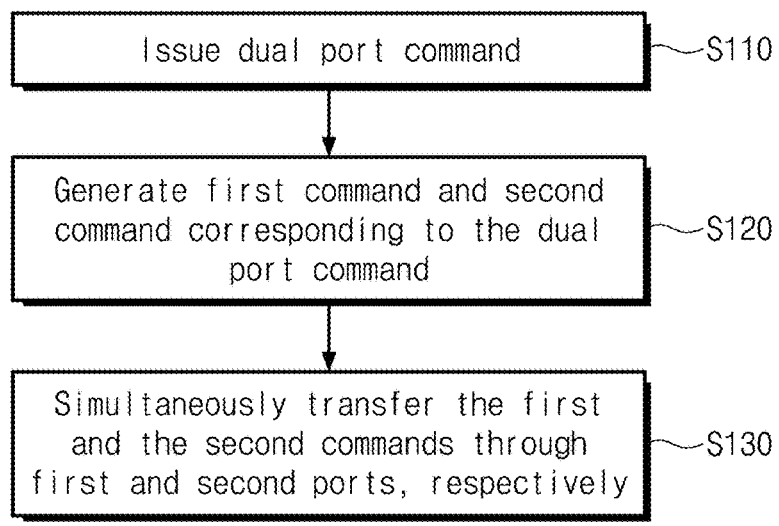
FIG. 9 is a drawing illustrating a command generating method of a host device, according to an embodiment.

FIG. 9 is a drawing illustrating a command generating method of a host device, according to an embodiment. A command generating method of the host device 100 will be described with reference to FIGS. 1 to 9.

The CPU 110 may issue a dual port command for a test operation by executing the test program (S110). The device driver may generate a first command to be transferred to the first port PT1 and a second command to be transferred to the second port PT2 in response to the dual port command (S120). Here, the device driver may determine if a dual port delimiter is included in the dual port command. The device driver may determine whether to support a dual port based on the result of determining if the dual port delimiter is included. If it is determined that the dual port is supported, the device driver may generate a command corresponding to each port. Afterwards, the first and second commands may be respectively transferred to the corresponding ports PT1 and PT2 at the same time (S130).

Although two commands have been used as an example, in other embodiments, the number of generated commands may be different. For example, in S110, a multi-port command may be issued. In S120, three or more commands may be generated based on information in the multi-port command. Those three or more commands may be simultaneously transferred through three or more ports in S130.

Figure 10:
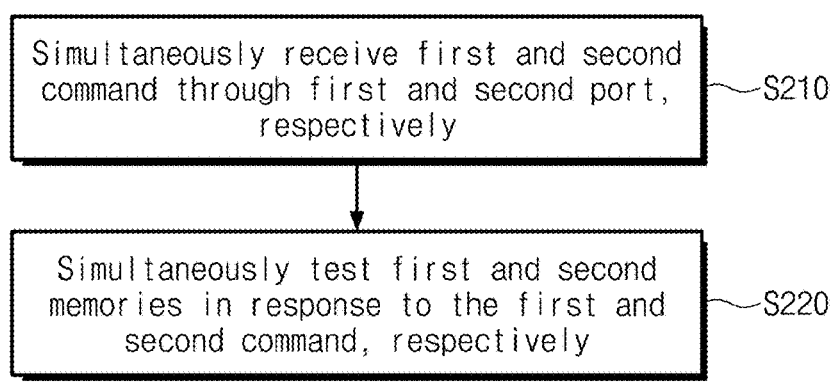
FIG. 10 is a drawing illustrating a test method of a dual port SSD, according to an embodiment.

FIG. 10 is a drawing illustrating a test method of a dual port SSD, according to an embodiment. Below, the test method of the dual port SSD will be described with reference to FIGS. 1 to 10.

To perform the test operation, the first and second ports PT1 and PT2 (refer to FIG. 1) of the dual port SSD may be activated. The first and second ports PT1 and PT2 may be activated according to control of the host device 100. However, the activation of the first and second ports PT1 and PT2 may be activated in different ways in other embodiments. The dual port SSD may simultaneously receive the first and second commands through the first and second ports PT1 and PT2 in S210. Here, the dual port SSD may store multiple first commands and multiple second commands. For example, the dual port SSD may receive and store the first commands through the first port PT1 in the queuing manner and may receive and store the second commands through the second port PT1 in the queuing manner.

Afterwards, the dual port SSD may test a first memory in response to the first commands while testing a second memory in response to the second commands in S220. Test result values may be transferred to the host device 100, for example, after being temporarily stored in a buffer.

In other embodiments, the test system may not be limited to a dual-port DUT. The test system according to an embodiment may be applicable to a DUT including three or more ports.

Figure 11:
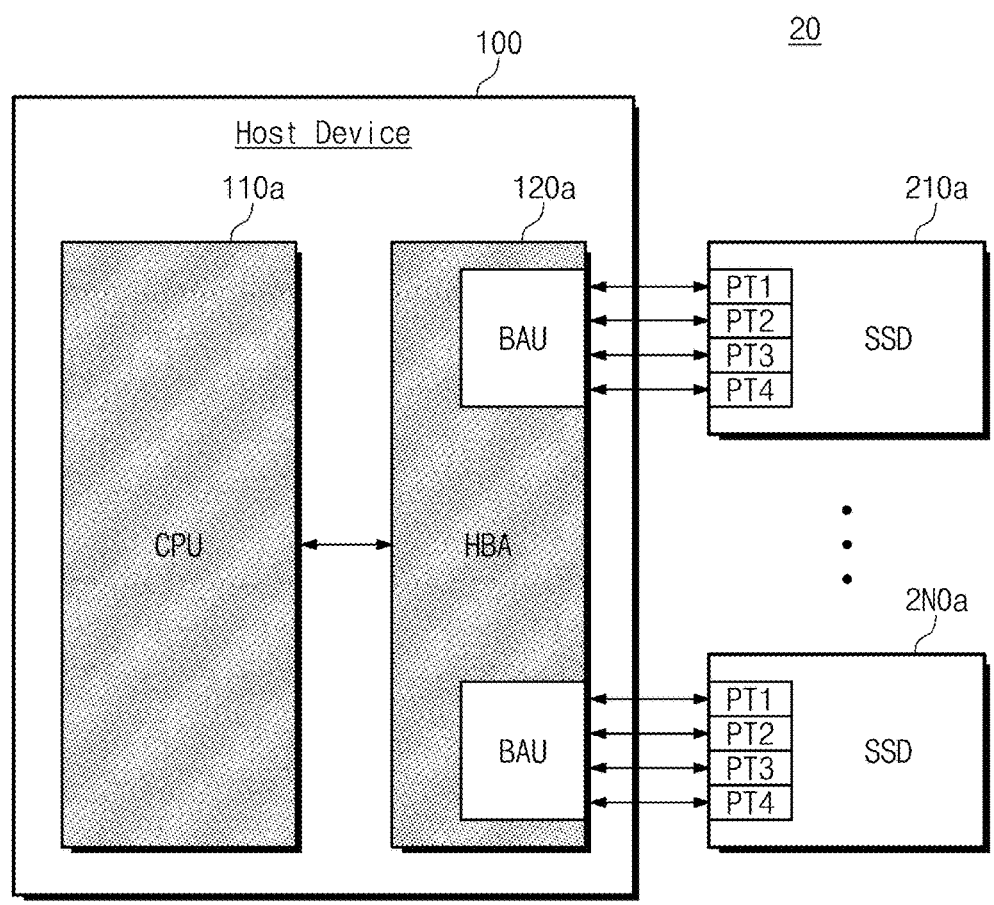
FIG. 11 is a drawing illustrating a test system according to another embodiment.

FIG. 11 is a drawing illustrating a test system according to another embodiment. Referring to FIG. 11, a test system 20 may include a host 100a and multiple DUTs 210a, . . . , 2N0a. The host 100a may test the DUTs 210a, . . . , 2N0a each of which is connected to the host 100a through four ports PT1, PT2, PT3, and PT4. Each of the DUTs 210a, . . . , 2N0a may activate the four ports PT1, PT2, PT3, and PT4 and may process commands, which are received through the activated ports PT1, PT2, PT3, and PT4, simultaneously and independently.

Figure 12:
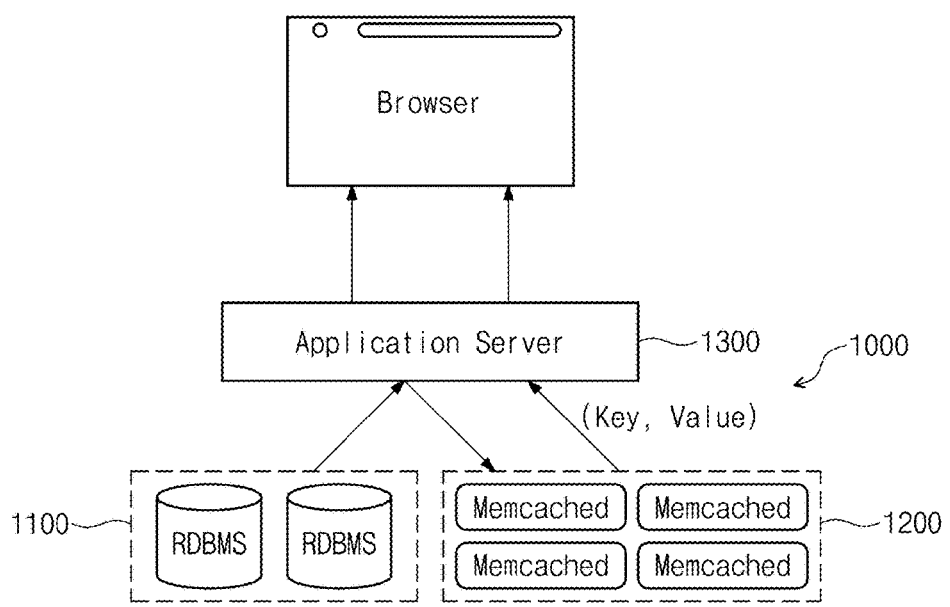
FIG. 12 is a drawing illustrating a data server system to which a storage device according to an embodiment is applied.

FIG. 12 is a drawing illustrating a data server system in which a storage device according to an embodiment is used. Referring to FIG. 12, a data server system 1000 may include a related database management system (RDBMS) 1100, a cache server 1200, and an application server 1300.

The cache server 1200 may be implemented to maintain and delete different key and value pairs in response to an invalidation notification from the database management system 1100. The database management system 1100 may include a dual port storage device described with reference to FIGS. 1 to 11.

The data server system 1000 according to an embodiment may perform a test operation through multiple ports more simply and quickly, thereby reducing management costs.

A SAS device according to an embodiment may improve a data transmission speed by efficiently performing write/read operations using multiple ports and may improve the efficiency of test by reducing a test time needed to perform a test operation quantitatively.

A SAD device testing method according to an embodiment may perform a test operation with the maximum performance by using multiple ports at the same time.

According to embodiments, it may be possible to improve a data transmission speed by efficiently performing write/read operations using multiple ports and to improve the efficiency of test by reducing a test time needed to perform a test operation quantitatively.

While embodiments have been described with reference to particular embodiments, it will be apparent to those skilled in the art that various changes, combinations, and modifications may be made without departing from the spirit and scope. Therefore, it should be understood that the above embodiments are not limiting, but illustrative.

What is claimed is:

1. A method of operating a test system that comprises a host device and at least one storage device having multiple ports connected to the host device through a multi-port connection, the method comprising:

issuing, by a test program at the host device, a first command, wherein the first command comprises an operation code, a first address, a flag indicating a dual port operation, and a second address;

generating, by a device driver at the host device, a plurality of second commands from the first command; and simultaneously transferring, by the host device, the second commands to each of the at least one storage device.

2. The method of claim 1, wherein:

the multi-port connection is a dual port connection; and the generating of the second commands comprises generating two commands corresponding to the first command.

3. The method of claim 1, wherein the generating of the second commands comprises determining, by the device driver, whether the flag exists in the first command.

4. The method of claim 3, wherein:

the generating of the second commands comprises generating a first generated command having the operation code and the first address and a second generated command having the operation code and the second address if the flag exists; and the simultaneously transferring of the second commands comprises simultaneously transferring the first generated command and the second generated command to each of the at least one storage device; and the first address of the first generated command is the same as the first address of the first command and the second address of the second generated command is the same as the second address of the first command.

5. The method of claim 1, further comprising receiving, by the host device, result values of test operations corresponding to the second commands.

6. The method of claim 5, further comprising transferring, by the host device, a plurality of new commands to each of the at least one storage device through the multi-port connection before the result values are received.

7. The method of claim 1, further comprising activating all of the multiple ports of the at least one storage device.

8. The method of claim 1,
wherein the second commands are transferred according to a peripheral component interconnect express (PCIe) interface.

9. A storage device comprising:
a first port;
a second port;
at least one nonvolatile memory device;
a first memory controller connected to the first port and configured to control at least a first part of the at least one nonvolatile memory device;
a second memory controller connected to the second port and configured to control at least a second part of the at least one nonvolatile memory device; and
a connector having the first port and the second port,
wherein the connector includes a first side surface on which signal pins corresponding to the first port are arranged and a second side surface that is opposite to the first surface and on which signal pins corresponding to the second port are arranged, and
wherein during a test operation:
the first memory controller is configured to receive a first command through the first port and control the at least the first part of the at least one nonvolatile memory device in response to the first command; and
the second memory controller is configured to receive a second command through the second port simultaneously with the first memory controller receiving the first command and control the at least the second part of the at least one nonvolatile memory device in response to the second command.

10. The storage device of claim 9, wherein
power and control pins are further arranged on the first side surface.

11. The storage device of claim 9, wherein
first pins for a peripheral component interconnect express (PCIe) sideband and power pins are further arranged on the first side surface; and
third pins for the PCIe sideband are further arranged on the second side surface.

12. The storage device of claim 9, wherein:
the at least one nonvolatile memory device comprises a single nonvolatile memory device; and
further comprising a bus through which each of the first and second memory controllers is configured to control the single nonvolatile memory device.

13. The storage device of claim 9, wherein:
the at least one nonvolatile memory device comprises a first nonvolatile memory device and a second nonvolatile memory device;
the first memory controller is configured to control the first nonvolatile memory device simultaneously with the second memory controller controlling the second nonvolatile memory device; and
the second memory controller is configured to control the second nonvolatile memory device simultaneously with the first memory controller controlling the first nonvolatile memory device.

14. The storage device of claim 9,
wherein the first and second ports comply with a nonvolatile memory device express (NVMe) interface.

15. A test system comprising:
a host device; and
a plurality of devices under test (DUTs), each of which is connected to the host device through a multi-port connection,
wherein the host device comprises:
a central processing unit; and
a host bus adapter connecting the central processing unit and the DUTs,
wherein during a test operation, the host device is configured to transfer simultaneously a first command and a second command to a first port of each of the DUTs and a second port of each of the DUTs, respectively, and
wherein a software architecture of the host device comprises an application layer configured to issue a multi-port command and a command layer configured to generate the first and second commands to be transferred to the DUTs from the multi-port command.

16. The test system of claim 15,
wherein the host bus adapter comprises a plurality of bus adapter units and each of the bus adapter units is connected to a corresponding one of the DUTs.

17. The test system of claim 15, wherein:
the multi-port command comprises an operation code, a first address, a sector count, features, a dual port delimiter, and a second address;
the first command comprises the operation code, the first address, the sector count, and the features; and
the second command comprises the operation code, the second address, the sector count, and the features.

* * * * *